(12) United States Patent
Jansen

(10) Patent No.: US 7,988,354 B2
(45) Date of Patent: Aug. 2, 2011

(54) TEMPERATURE DETECTION FOR A SEMICONDUCTOR COMPONENT

(75) Inventor: Uwe Jansen, Werl (DE)

(73) Assignee: Infineon Technologies AG, Neubiberg (DE)

(*) Notice: Subject to any disclaimer, the term of this patent is extended or adjusted under 35 U.S.C. 154(b) by 617 days.

(21) Appl. No.: 11/964,116

(22) Filed: Dec. 26, 2007

(65) Prior Publication Data
US 2009/0167414 A1 Jul. 2, 2009

(51) Int. Cl.
G01K 7/01 (2006.01)
G01K 7/14 (2006.01)
H01L 29/00 (2006.01)

(52) U.S. Cl. ........ 374/170; 374/178; 374/184; 374/185; 374/171; 374/172; 324/762.01; 257/470

(58) Field of Classification Search .................. 374/100, 374/170–173, 178, 183–185, 163, 114; 327/512, 327/513; 361/93.8, 103; 702/130–136, 139; 324/765, 768, 769, 762.01
See application file for complete search history.

(56) References Cited

U.S. PATENT DOCUMENTS

| | | | |
|---|---|---|---|
| 4,039,928 A * | 8/1977 | Noftsker et al. ............... | 323/326 |
| 4,358,728 A * | 11/1982 | Hashimoto .................... | 323/275 |
| 4,430,608 A * | 2/1984 | Nesler ............................ | 323/282 |
| 4,830,514 A * | 5/1989 | Begehr et al. ................. | 374/178 |
| 5,231,358 A * | 7/1993 | Kapsokavathis et al. ..... | 324/672 |
| 5,559,500 A * | 9/1996 | Kase .............................. | 340/664 |
| 5,844,760 A * | 12/1998 | Kumagai et al. ................ | 361/58 |
| 5,909,108 A * | 6/1999 | He et al. ........................ | 323/225 |
| 6,060,792 A * | 5/2000 | Pelly ............................. | 307/117 |
| 6,133,616 A | 10/2000 | Sobhani et al. | |
| 6,215,634 B1 * | 4/2001 | Terasawa ....................... | 361/100 |
| 6,288,597 B1 * | 9/2001 | Hasegawa et al. ............. | 327/513 |
| 6,486,523 B2 | 11/2002 | Tomomatsu | |
| 6,831,447 B1 * | 12/2004 | Wittenberg ................... | 323/222 |
| 6,835,994 B2 | 12/2004 | Kistner et al. | |
| 7,397,264 B2 * | 7/2008 | Dolian .......................... | 324/769 |
| 2005/0212679 A1 | 9/2005 | Norrena et al. | |
| 2006/0214704 A1 * | 9/2006 | Nakano ......................... | 327/110 |
| 2009/0024345 A1 | 1/2009 | Prautzsch | |
| 2010/0001785 A1 * | 1/2010 | Baginski et al. .............. | 327/513 |
| 2010/0150202 A1 * | 6/2010 | Asano et al. .................... | 374/44 |

FOREIGN PATENT DOCUMENTS

| | | |
|---|---|---|
| DE | 2656466 A * | 6/1978 |
| DE | 19852080 C1 | 8/2000 |
| DE | 10125694 A1 | 1/2003 |
| DE | 19630902 B4 | 7/2005 |
| DE | 102004009082 B4 | 8/2006 |
| EP | 0550850 B1 | 9/1997 |
| WO | 9837581 A3 | 8/1998 |

* cited by examiner

Primary Examiner — Gail Verbitsky
(74) Attorney, Agent, or Firm — Dicke, Billig & Czaja, PLLC

(57) ABSTRACT

Temperature detection for a semiconductor component is disclosed. One embodiment includes a circuit arrangement for measuring a junction temperature of a semiconductor component that has a gate electrode and a control terminal being connected to the gate electrode and receiving a control signal for charging and discharging the gate electrode, where the gate electrode is internally connected to the control terminal via an internal gate resistor. The circuit arrangement includes: a measuring bridge circuit including the internal gate resistor and providing a measuring voltage which is dependent on the temperature dependent resistance of the internal gate resistor; an evaluation circuit receiving the measuring voltage and providing an output signal dependent on the junction temperature; a pulse generator providing a pulse signal including pulses for partially charging or discharging the gate electrode via the internal gate resistor.

20 Claims, 4 Drawing Sheets

TEMPERATURE DETECTION FOR A SEMICONDUCTOR COMPONENT

BACKGROUND

The invention relates to the field of power electronics and power semiconductor modules.

Today power electronic equipment is commonly manufactured using field controlled power semiconductor devices like MOSFETs and IGBTs, either as discrete semiconductor devices or as power semiconductor modules, including several chips in parallel to achieve higher currents or including all the power semiconductor chips necessary for forming an inverter on an insulated substrate. Providing over-temperature protection of the power semiconductor components or providing temperature measurement capability is a requirement in most power semiconductor applications.

Typically, temperature sensors for temperature measurement or over-temperature detection are arranged on a base plate, a substrate or on a heat sink of a power semiconductor device or a power semiconductor module. Base plate, substrate and/or heat sink are thermally coupled to the semiconductor body where heat is dissipated. With the aid of loss models, an estimation is made about the thermal state of the semiconductor component, in particular about the junction temperature of the semiconductor chip(s) arranged within the power module or the device package.

In semiconductor devices or semiconductor modules which have a large spatial expansion, considerable deviations can be observed between the estimated temperature and the actual temperature of the semiconductor chip, in particular if the semiconductor chips are subjected to asymmetrical load and cooling conditions or to rapid changes of power dissipation. Furthermore, variations of the thermal resistances of a semiconductor component due to degradation caused by thermal cycling or power cycling are difficult to consider in the model used for temperature estimation.

The accuracy of the temperature measurement increases, the closer the temperature sensor is placed to the dissipating heat source, i.e. the pn-junction of a semiconductor component. For example, the temperature sensors can be glued to the semiconductor chip. However, the thermal coupling is a function of the thermal conductivity of the adhesive as well as of the dynamic characteristics of the temperature detection by the temperature sensor.

Finally, it is possible to integrate temperature sensors into the semiconductor chip of the semiconductor component in the form of resistors or diodes. In these cases it is necessary to provide additional circuit components either in the semiconductor body, which entails that valuable chip surface is lost for the integration of a temperature sensor.

As an outcome, the production process becomes more complex in response to the direct integration of thermo-sensors in the semiconductor chip by using additional elements and the yield can thus decrease. Altogether, measures for integrating additional components into the semiconductor chip increases costs. Finally, such integral solutions cannot be used for the temperature detection of standard semiconductor devices which do no include additionally integrated thermo-sensors.

SUMMARY

A circuit arrangement is presented for measuring a temperature within a semiconductor component that has a gate electrode and a control terminal being connected to the gate electrode and receiving a control signal for charging and discharging the gate electrode, the gate electrode being internally connected to the control terminal via an internal gate resistor, the circuit arrangement including: a measuring bridge circuit including the internal gate resistor and providing a measuring voltage which is dependent on the temperature dependent resistance of the internal gate resistor; an evaluation circuit receiving the measuring voltage and providing an output signal dependent on the junction temperature; a pulse generator providing a pulse signal including pulses for partially charging or discharging the gate electrode via the internal gate resistor.

A method is presented for measuring the temperature within a semiconductor component having a control electrode which is internally connected to a control terminal via an internal gate resistor. The method includes the steps of partially charging or discharging the control electrode of the semiconductor component via the internal gate resistor, whereby effecting a voltage drop across the gate resistor, and evaluating a measuring voltage dependent on the voltage drop during the charging or discharging of the control electrode.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
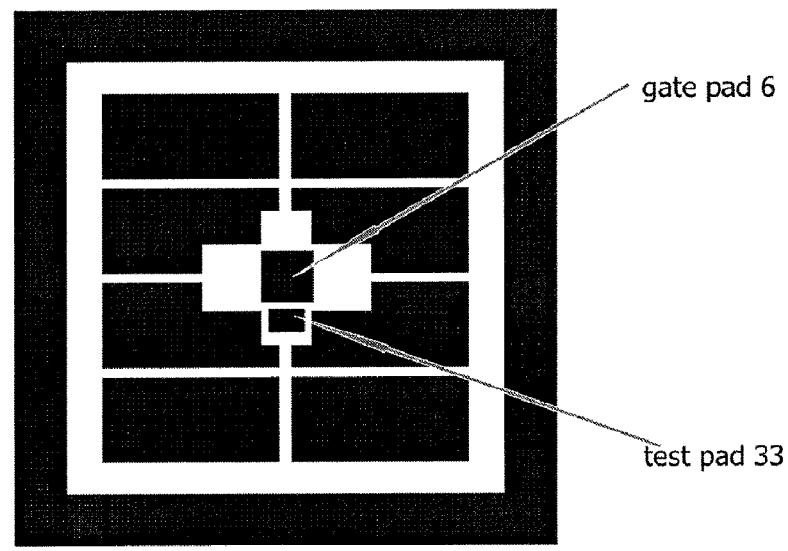
FIG. 1 illustrates a top view of the metallization of a semiconductor body including a gate pad and a test pad that is directly connected to the gate electrode.

Internal gate resistors are used in power semiconductor chips intended for parallel connection of several semiconductor chips in order to increase the ampacity of the overall power module. Parallel connection of field controlled power semiconductor chips without providing individual gate resistors for each chip leads to instabilities and oscillation. An effective method to provide such an internal gate resistor is the monolithic integration on the power semiconductor chip. This can be done by manufacturing a polysilicon resistor together with the polysilicon layer for internal gate connection. One terminal of this resistor is connected to a gate pad 6, the other is connected to the "internal" gate. To enable testing of the internal gate resistor during production this internal gate is connected to a test pad 33. FIG. 1 is a top view of a semiconductor body including the gate pad 6 for "external" connection and a test pad 33. Although the main objective of providing internal gate resistors is to enable easy paralleling, chips with internal gate resistors are commonly used even when paralleling inside a module is not intended.

Due to being manufactured from polysilicon these internal gate resistors illustrate a temperature coefficient of 0.125%/K.

Figure 2:
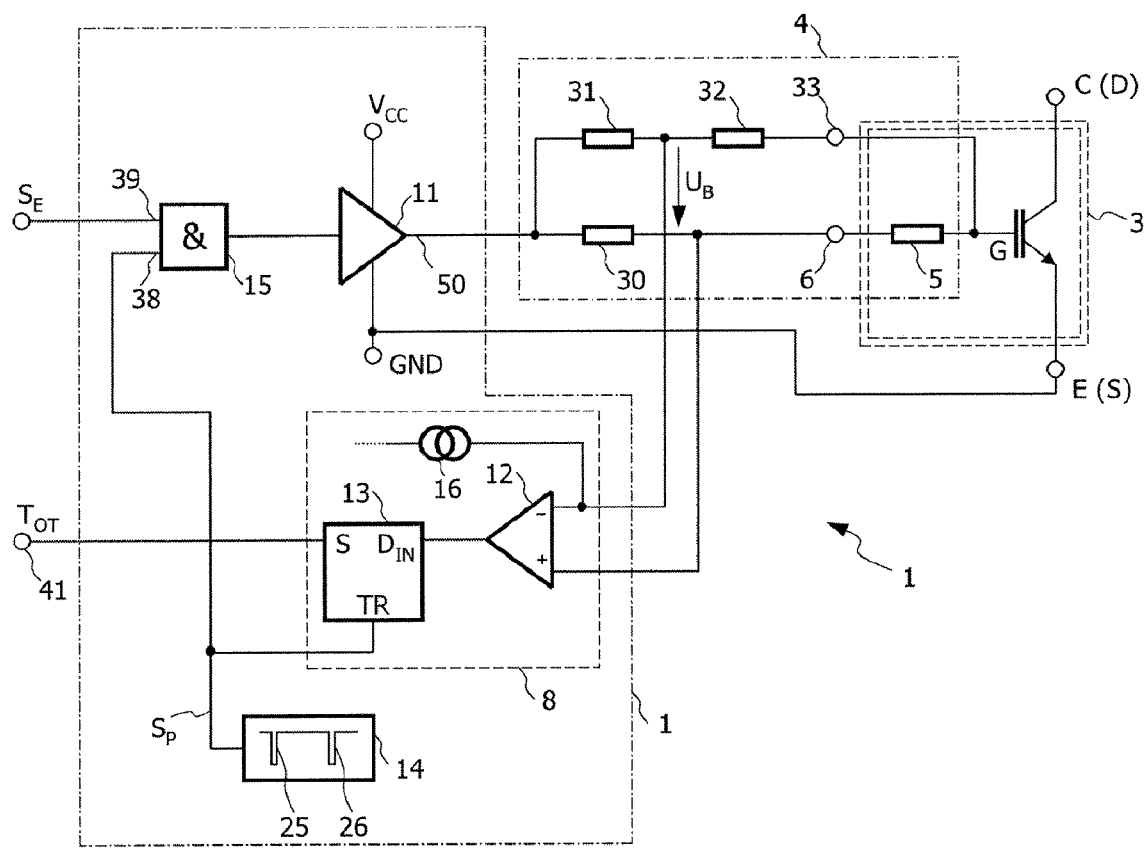
FIG. 2 illustrates a circuit diagram of a temperature detection circuit.

FIG. 2 is a circuit diagram of a temperature detection circuit 1 for a power semiconductor component 3 including an internal gate resistor 5. A bridge circuit 4 includes the internal gate resistance 5, the external gate resistor 30 and two additional resistors 31 and 32. The internal gate resistor 5 is connected to the remaining components of the bridge circuit via the gate pad (control terminal 6, cf. FIG. 1) of the semiconductor component 3 and via the test pad (additional control terminal 33). The temperature detection circuit 1 includes a pulse generator 14 connected to a driver output stage 11 of a driver circuit 10 which drives the control terminal 6. The driver output stage 11 and the pulse generator 14 are employed for generating a measuring signal during brief measuring pulses 25, 26.

The temperature detection circuit 1 further includes an evaluation circuit 8 having access to the bridge diagonal voltage $U_B$ of the bridge circuit 4, wherein the evaluation circuit 8 includes at least one output 41 for providing an over-temperature signal $T_{OT}$.

With such temperature detection circuit 1, the internal gate resistor 5 of the semiconductor component 3 forms basis for the temperature measurement without having to provide additional thermo-sensors externally on a semiconductor component 3 or a semiconductor module. This circuit arrangement 1 is especially useful for being integrated into an IPM (intelligent power module). Therefore the chip-external driver circuit 10 of the IPM is supplemented with only the pulse generator 14, the evaluation circuit 8 and the resistors 30, 31, and 32 that, together with the internal gate resistor 5, form the bridge circuit 4. Thereby the power semiconductor component 3 itself does neither need to provide an additional temperature sensor nor any additional pad or terminal since the control terminal 6 (test pad) has to be provided anyway for testing the semiconductor component 3 during fabrication.

However, many types of IGBTs and MOSFETs have an internal gate resistor for reasons already discussed above. This gate resistor 5 can be used for the temperature measurement. Such internal gate resistors enable, for example, the parallel connection of a plurality of transistor cells of a power transistor. The parallel connection is realized by using polysilicon which includes a temperature coefficient of 0.125%/K. This temperature coefficient is substantially independent on process parameters during production of semiconductor components such as the power semiconductor component 3. However, if deviations from an absolute value occur, their effect can be eliminated by using a simple compensation method.

Due to the fact that the gate resistance 5 is typically low in order to allow for fast switching of the power semiconductor component 3, a high measuring current is required for the temperature measurement. Alternatively costly operational amplifiers and comparators would have to be provided for processing extremely low voltages. However, offset voltages, thermo-voltages and, above all, EMI influences (electromagnetic interference) limit the processing of low voltages and consequently the measuring current can not be chosen arbitrarily low.

In order to eliminate the need for an extra current source for providing the measurement current to the internal gate resistor 5, the driver output stage 11 is sequenced off for a short period of time defined by the pulses 25, 26 of pulse generator 14 during the on-state of the semiconductor switch (e.g., IGBT, MOSFET, etc.), thus partially discharging the gate. In doing so, it should be ensured that the gate voltage of the IGBT remains above the Miller Plateau in order to keep the semiconductor switch in an on-state. The sequencing-off of the driver output-stage 11 can be implemented, for example, by using a gate circuit 15, such that the pulses 25, 26 "blank" the input signal $S_E$ of the driver output-stage 11, thereby resulting in a low level at the output 50 of the driver output stage 11. This concept allows for a sufficiently high measurement current, whereby total charge "removed" from the gate of the semiconductor switch is kept small (and therefore unproblematic) due to relatively short pulse length of the pulses 25, 26.

During the pulses 25, 26, the driver output stage 11 operates as a current source. The resulting driver output voltage is not directly supplied to the control terminal 6 but to the bridge circuit 4. For the temperature detection the resulting voltage $U_B$ is evaluated at the bridge diagonal. However, it is also possible to directly evaluate the voltage across the internal gate resistor 5 for temperature measurement, but the bridge circuit usually allows for a more precise measurement and provides other advantages as can be seen from the example of FIG. 3.

During the pulse 25 or 26, respectively, which is triggered by the pulse generator 14, the entire voltage $V_{CC}$ available for the driver circuit 10, except for the voltage drop in the driver output stage 11, is applied at the bridge circuit 4 with a slight partial discharge of the gate so that the largest possible output signal is present at the bridge diagonal. After this brief discharge pulse 25 or 26 for temperature detection, the gate is recharged. This measurement process can be repeated several times while the semiconductor component 3 is in its on-phase.

The temperature detection circuit 1 includes the three main components which have already been mentioned above, namely the bridge circuit 4, the pulse generator 14 and the evaluation circuit 8. These components can also be integrated into a conventional driver circuit 10 for controlling and driving the semiconductor component 3.

In FIG. 2, the elements of the semiconductor component 3 are enclosed by a double-dashed line. The semiconductor component 3 has a control input including a control terminal 6 (i.e. the gate pad), which provides access to the internal gate electrode G of an IGBT $T_1$ via the internal gate resistor 5. Furthermore, the semiconductor component 3 includes a collector electrode C as power electrode 28 and an emitter electrode E as power electrode 18. Of course the IGBT $T_1$ may be substituted by a MOSFET. In this case the power electrodes 28, 18 are denoted as drain and source electrodes D, S. Within the semiconductor component 3, a temperature-dependent low-resistance internal gate resistor 5 is arranged as already discussed above. The internal gate resistor 5 is accessible via the control terminal 6 (gate pad) and the test pad 33. The test pad 33 is present in almost all power semiconductor components 33 adequate for being used in IPMs (intelligent power modules) so that this test pad 33 can be used for connecting to the temperature detection circuit 1.

An external measuring resistor 30 is disposed between the driver output stage 11 and the gate pad 6 in a low-resistance bridge arm. Parallel to the low-resistance bridge arm including the measuring resistor 30 and the internal gate resistor 5, respectively, a high-resistance bridge arm is connected in parallel. This high-resistance bridge arm includes a first comparison resistor 31 and a second comparison resistor 32.

The measuring current for the bridge circuit 4 including the low-resistant and high-resistance bridge arm is supplied by driver output stages 11, which are provided in conventional driver circuits 10 for corresponding semiconductor switching components such as the semiconductor component 3. The main object of such a driver output stage 11 is to generate the gate current for switching the semiconductor component 3, i.e. the IGBT $T_1$, on and off. However, the gate current can be switched to measuring current by using brief measuring pulses 25, 26 without affecting the conducting state of the semiconductor component 3, if the gate voltage is maintained above the Miller Plateau.

A pulse signal $S_P$ including pulses 25, 26 is generated by the pulse generator 14 and supplied to a first input 38 of the AND-gate 15 of the driver circuit 10. The input Signal $S_E$ of the driver circuit 10 is supplied to a second input of the AND-gate 15.

The discharge pulse generator 14 generates the pulse signal $S_P$ which is normally at a high level and at a low level during pulses 25 and 26 that have a pulse length $t_p$ in the range of a few nanoseconds, for example, 20 ns$\leq t_p \leq$100 ns. By using the AND-gate 15 the input signal $S_E$ is blanked during the pulses 25, 26, and forwarded to the driver output stage 11 during the time span between two pulses of the pulse signal $S_P$.

When the gate of the IGBT $T_1$ is charged to a high level, i.e. a voltage level greater than the Miller Plateau of the respective IGBT, the IGBT is in an on-state. If, while the IGBT is on, the input signal $S_E$ is blanked due to a pulse in the pulse signal $S_P$ and the driver output stage 11 provides a low level at its output 50 to the bridge circuit 4, then the gate electrode G of the IGBT slightly discharges through the resistors of the bridge circuit for the short time period of a pulse 25, 26. The high discharge current, which flows through the bridge circuit 4, generates a voltage signal $U_B$ across die bridge diagonal. The bridge diagonal signal $U_B$ is supplied to an evaluation circuit 8 for over-temperature detection.

As depicted in FIG. 2, the evaluation circuit 8 includes a comparator 12 and a latch circuit 13 for generating a over-temperature detection signal $T_{OT}$. The output of the comparator 12 is connected to the input $D_{in}$ of the latch circuit 13. A trigger input TR of this latch circuit 13 receives the pulse signal $S_P$. If the bridge diagonal voltage $U_B$ exceeds a given threshold then the over-temperature detection signal $T_{OT}$ is set to a high level when the latch is triggered by a pulse 25, 26. The threshold may be adjusted by using a current source 16 connected to the common node of comparison resistors 31, 32 of the bridge circuit 4. The threshold thereby varies with the current of the current source 16 and the switching point for an excess temperature warning or for an excess temperature shut-down of the semiconductor component 3 or of the semiconductor module can thus be shifted to a desired temperature. However, other methods for adjusting the threshold are applicable.

After the short discharge pulses 25 or 26 for temperature detection, the control electrode G is recharged via the resistors of the bridge circuit 4. Such a measuring process can be repeated several times, while the semiconductor component 3 is in an on-state. With a pulse-duty factor of 1:1000 of the pulse generator 14 and a discharge period of 50 ns, for example, scanning ranges of 20 kHz (kilohertz) are possible for the temperature detection, without allowing the total power consumption of the temperature detection device 1 to become unacceptably high.

Instead of the evaluation circuit 8 including of a comparator 12 and a latch circuit 13, the bridge diagonal signal $U_B$ can also be used provided to a more complex evaluation circuit that actually measures the temperature. Such an evaluation circuit is illustrated in FIG. 4 and can be incorporated into the example of FIG. 2 as well as in the arrangement of FIG. 3.

In order to be able to balance production tolerances of the internal gate resistor 5, it is possible to balance one of the resistances 30, 31 and 32 during the final testing of the semiconductor component 3 by using, for example, a laser ablation.

Figure 3:
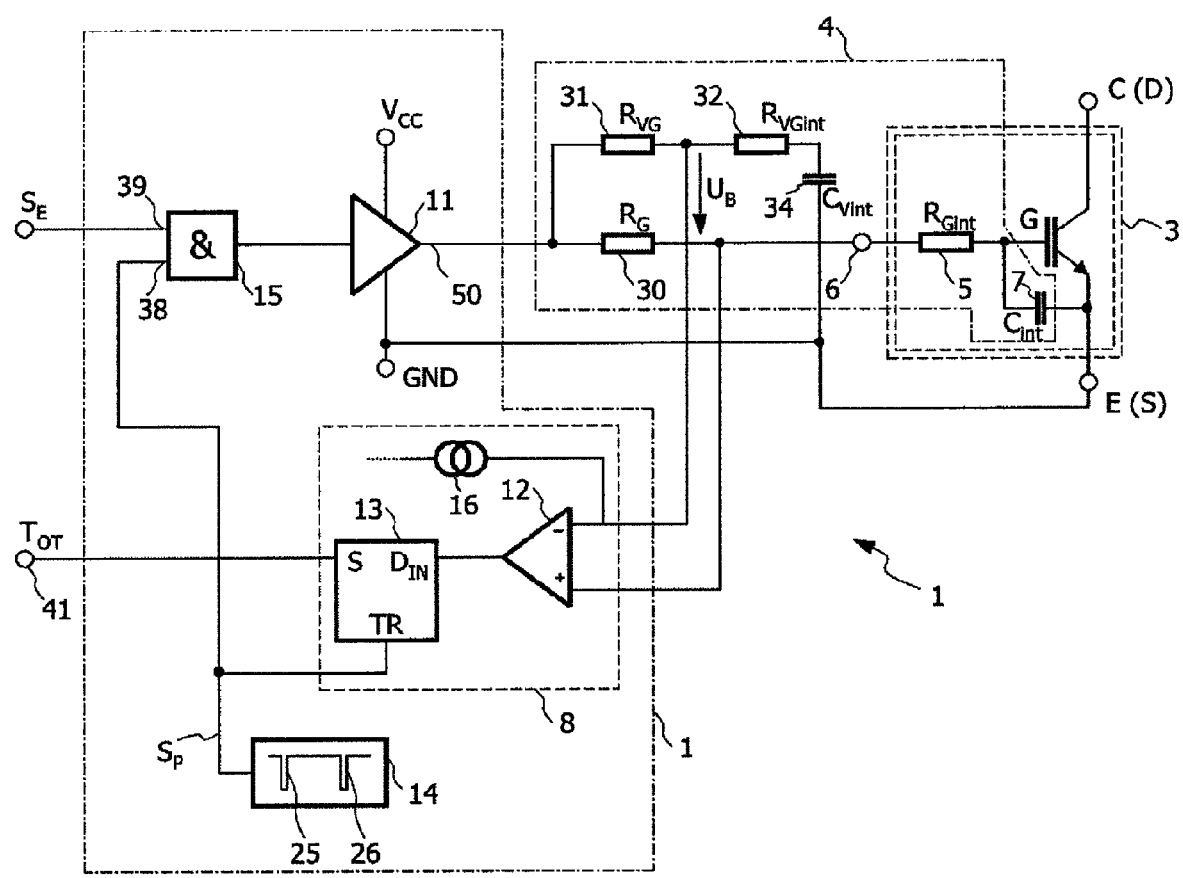
FIG. 3 illustrates a circuit diagram of another temperature detection circuit.
Figure 4:
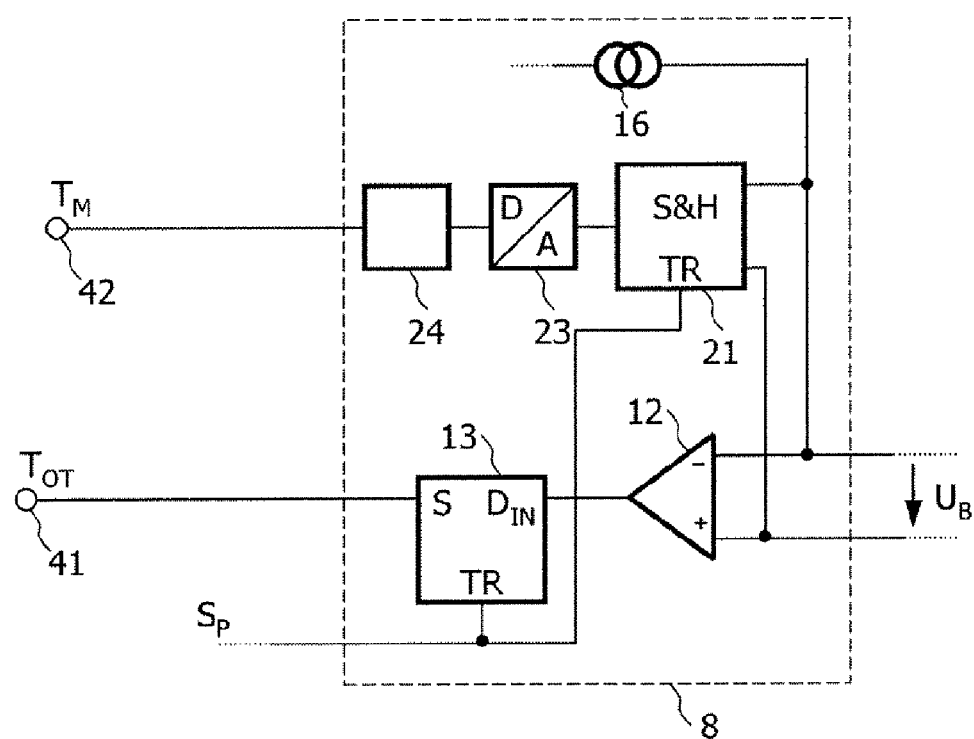
FIG. 4 illustrates a circuit diagram of an alternative evaluation circuit for the temperature detection circuits of FIG. 2 or 3.

FIG. 3 illustrates a basic circuit diagram of a temperature detection device 2 according to a second example of the invention. Components having the same functions as in FIG. 2 are labeled with the same reference numerals and are not separately discussed.

In the example of FIG. 2 the semiconductor component needs an extra connection, for example a bond wire, to electrically contact the test pad 33. However, with the present example of FIG. 3 a connection of the internal gate electrode via the test pad 33 is not necessary any more. Consequently the present invention can also be successfully applied to discrete standard power semiconductor switches arranged in a standard housing with only three external terminal pins (gate pin, collector or drain pin, and emitter or source pin).

The example of FIG. 3, illustrates a temperature detection circuit 1, where no additional measuring pads or terminals and no additional thermo-sensors or whatsoever are required. The arrangement of FIG. 3 provides a temperature detection circuit 1 for a semiconductor components 9, which includes only one control terminal 6 (gate pad) and two power terminals 18 or 28, respectively. In this arrangement, the junction temperature of the semiconductor component 9 can also be monitored with the help of the temperature detection circuit 1. The crucial difference to the example of FIG. 2 is in the design of the bridge circuit 4. The first bridge arm includes a series circuit of the resistor 30, the internal gate resistor 5 and the intrinsic gate capacitance 7 which is always present between the gate electrode and the emitter or source electrode, respectively, in field effect transistors. The second bridge arm includes a series circuit of the comparison resistors 31 and 32 and the comparison capacitor 34 ("mirror capacitor").

Compared to the example of FIG. 2 the internal gate resistor 5 is "replaced" by the "internal" RC element including the gate resistor 5 and the gate capacitor 7, and the comparison resistor 32 is replaced by a respective "external" RC element, too. The functions of the pulse generator 14 and the evaluation circuit 8 are the same as described above with reference to FIG. 2.

A measuring voltage $U_B$ can be observed across the bridge diagonal. For this purpose, the resistances in the bridge circuit 17 satisfy the following equations:

$$R_G/R_{Gint} = R_{VG}/R_{Vgint} \tag{1}$$

$$(R_G+R_{Gint})\cdot C_{int}=(R_{VG}+R_{VGint})\cdot C_V \quad (2)$$

wherein $R_G$ is the resistance of resistor 30, $R_{Gint}$ the resistance of the internal gate resistor 5, $R_{VG}$ the resistance of the comparison resistor 31, $R_{VGint}$ the resistance of the comparison resistor 32, $C_{VG}$ the capacitance of the comparison capacitor 34, and $C_{int}$ the capacitance of the intrinsic gate capacitor 7.

The intrinsic gate capacitor $C_{int}$ is the differential capacitance between the gate and the emitter of an IGBT (or between the gate and the source of an MOSFET), which can be determined by evaluating the gate charge curve above the Miller Plateau.

If the above-indicated conditions of eq. (1) and eq. (2) are satisfied, the same voltage is reached for the voltages above the Miller Plateau at the reference capacitance $C_V$ as at the internal gate. As has been previously described with reference to the first example of the invention, the four resistors form a bridge circuit 4 and, provided that the other resistances of the bridge are temperature-independent, a voltage signal $U_B$, which is a function of the temperature of the internal gate resistance 5, can be observed across the bridge diagonal.

In one embodiment, the use of a controlled supply voltage $V_{CC}$ for supplying the driver circuit 10 is used for a precise temperature measurement, since fluctuations of the supply voltage $V_{CC}$ could deteriorate the measuring value. However, such stabilized supply voltage $V_{CC}$ is not necessary, if only a threshold value evaluation for warning or shut-down of the semiconductor component 9 is desired, as illustrated in FIG. 2 and FIG. 3 with evaluation circuit 8.

In the present example of FIG. 3, access to the internal gate via the test pad 33 is not necessary. As a consequence this example of the invention is not only suitable for use in IMPs but also for use with discrete semiconductor components or standard modules.

The temperature detection circuit 1 can be installed into individually marketed driver components without noticeably increasing the costs. With driver components including the temperature detection device 1 according the example of FIG. 3, most of the semiconductor components 9 available on the market can thus be equipped with a reliable junction temperature monitoring and/or measurement unit, without having to provide a high expenditure of additional thermo-sensors or other components for the thermo-monitoring or temperature measurement of the semiconductor chips.

A method for the temperature detection of a semiconductor component 3 or 9 by using the above-described temperature detection circuits 1 of FIG. 2 or FIG. 3, respectively, includes the following steps: charging or discharging the gate G of the semiconductor component 3, 9 via an internal gate resistor, where the charging discharging is triggered by short pulses 25, 26 of a pulse signal $S_P$; evaluating the temperature dependent voltage drop across the internal gate resistor 5 or across the series circuit including the internal gate resistor 5 and the intrinsic gate capacitor 7.

In the evaluation process the diagonal voltage $U_B$ of a bridge circuit 4 is used for further signal processing. The bridge circuit 4 includes the internal gate resistor 5 or a series circuit of the internal gate resistor 5 and the intrinsic gate capacitor 7.

The evaluation process may comprise: assessing the bridge diagonal voltage signal $U_B$ in response to an edge of the pulse signal $S_P$ to determine whether the junction temperature of the semiconductor component 3, 9 exceeds a given threshold temperature; and signaling an over-temperature by setting a over-temperature signal $T_{OT}$ to a defined logic level.

If the actual temperature is to be monitored and/or recorded, a more complex evaluation circuit may be employed as illustrated, for example, in FIG. 4.

FIG. 4 is a schematic block diagram of an alternative evaluation circuit 8 for the temperature detection circuit 1.

Besides an evaluation of the bridge diagonal voltage $U_B$ by using the comparator 12 and latch circuit 13 (cf. FIG. 2 and FIG. 3), the bridge diagonal voltage $U_B$ can be additionally supplied to a sample and hold circuit 21. The sample and hold circuit 21 is also triggered by the pulses 25, 26 generated by the pulse circuit 14. The diagonal voltage signal is thus held on the level during the pulses 25, 26 and then digitized by an analog-to-digital converter 23 and stored in a memory 24. The stored temperature measurement signals $T_M$ are provided at a temperature measurement signal output 42.

With the above-disclosed discharge pulse width $t_p$ of 20 ns$\leq t_p \leq$100 ns (nanoseconds), a repetition frequency or scanning frequency $f_p$ of the temperature measurement values can be achieved between 10 kHz$\leq f_p \leq$50 kHz (kilohertz) during the passage phase of the semiconductor component 3 or 9. In the arrangement of FIG. 4, the temperature detection device cannot only be used for monitoring and shut-down but also for an accurate measurement of the junction temperature of power field effect transistors FETs, as well as for the measurement of the junction temperature of power transistors including an insulated gate IGBT or also for the measurement of the junction temperature for power semiconductor components in IPM technology (intelligent power module technology).

Although examples of the present invention have been described herein above in detail, it is desired, to emphasis that this has been for the purpose of illustrating the present invention and should not be considered as necessarily limitative of the invention. It is being understood that many modifications and variations can be made by those skilled in the art while still practicing the invention claimed herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit arrangement for measuring a junction temperature of a semiconductor component that has a gate electrode and a control terminal being connected to the gate electrode and receiving a control signal for charging and discharging the gate electrode, the gate electrode being internally connected to the control terminal via an internal gate resistor, the circuit arrangement comprising:
   a measuring bridge circuit comprising the internal gate resistor and providing a measuring voltage which is dependent on the temperature dependent resistance of the internal gate resistor;
   an evaluation circuit receiving the measuring voltage and providing an output signal dependent on the junction temperature; and
   a pulse generator providing a pulse signal comprising pulses for partially charging or discharging the gate electrode via the internal gate resistor.

2. The circuit arrangement of claim 1, further comprising:
   a driver output stage for providing the control signal to the control terminal for charging and discharging the gate electrode.

3. The circuit arrangement of claim 2, where the driver output stage receives an input signal and where the circuit arrangement further comprises a gate circuit configured to turn off the input signal in response to the pulses of the pulse signal.

4. The circuit arrangement of claim 1, where the measurement bridge circuit has four arms, one of the arms comprising the internal gate resistor.

5. The circuit arrangement of claim 1, wherein the measurement bridge circuit has four arms, one of the arms comprising the internal gate resistor and an intrinsic gate capacitor of the semiconductor component connected in series to the internal gate resistor, wherein the intrinsic gate capacitor couples the gate electrode and the emitter electrode.

6. The circuit arrangement of claim 1, where measurement bridge circuit is connected between the driver output stage and the control terminal, such that the control signal is provided to the control terminal via the measurement bridge circuit.

7. The circuit arrangement of claim 1, where the driver output stage provides a control signal depending on an input signal.

8. The circuit arrangement of claim 6, where the driver output stage is adapted for providing a control signal representing a logic combination of the input signal and the pulse signal and where gate circuit comprising two inputs receiving the input signal and the pulse signal respectively.

9. The circuit arrangement claim 1, where the evaluation circuit is adapted for processing the measuring voltage only at points in time defined by the discharge pulses.

10. The circuit arrangement of claim 9, where the evaluation circuit comprises a latch being connected to the measurement bridge circuit and providing the output signal, the latch being triggered by the discharge pulses for updating the output signal.

11. The circuit arrangement of claim 9, where the evaluation circuit comprises a sample-and hold-circuit receiving the measuring voltage and providing a temperature signal, where the sample-and hold-circuit is triggered by the discharge pulses, and where an analog-to-digital converter is connected downstream of the sample-and hold-circuit.

12. The circuit arrangement of claim 11, where a memory is connected downstream of the analog-to-digital converter.

13. The circuit arrangement of claim 1, where the measurement bridge circuit is a Wheatstone-Bridge having a first and a second supply terminal, and a first and a second measurement terminal, the measuring terminals providing the measuring voltage, the first supply terminal being connected to the driver circuit, and the second supply terminal being connected to the control electrode of the semiconductor component.

14. The circuit arrangement of claim 13, where a first reference resistor is connected between the first supply terminal and the first measuring terminal, a second comparison resistor is connected between the first measuring terminal and the second supply terminal, the line resistance is connected between the second supply terminal and the second measuring terminal, and a measuring resistor is connected between the second measuring terminal and the first supply terminal.

15. The circuit arrangement of claim 1, where the measurement bridge circuit has a first and a second supply terminal, and a first and a second measurement terminal, the measuring terminals providing the measuring voltage.

16. The circuit arrangement of claim 15, wherein a first reference resistor is connected between the first supply terminal and the first measuring terminal, a series circuit of a second comparison resistor and a reference capacitor is connected between the first measuring terminal and the second supply terminal, the a series circuit of the line resistance and a parasitic capacitance of the semiconductor component is connected between the second supply terminal and the second measuring terminal, and a measuring resistor is connected between the second measuring terminal and the first supply terminal.

17. A method for measuring the junction temperature of a semiconductor component having a control electrode being internally connected to a control terminal via an internal gate resistor, the method comprising:

partially charging or discharging the control electrode of the semiconductor component via the internal gate resistor, thereby effecting a voltage drop across the series circuit comprising the internal gate resistor and the intrinsic gate capacitor; and evaluating a measuring voltage dependent on the voltage drop during the discharging of the control electrode which is representative of the junction temperature;

generating discharge pulses of a given pulse width and with a given repetition rate for triggering the discharging of the control electrode of the semiconductor component and for triggering the evaluating process, sampling the measuring voltage at rising or falling edges of the discharge pulses; and digital-to-analog converting the sampled values of the measuring voltage for providing a digital temperature signal.

18. The method of claim 17, where the pulse width is within a range from 20 to 100 nanoseconds.

19. The method of claim 17, where the pulse repetition rate is up to 20 kilohertz.

20. A method for measuring the junction temperature of a semiconductor component having a control electrode being internally connected to a control terminal via an internal gate resistor, the method comprising:

partially charging or discharging the control electrode of the semiconductor component via the internal gate resistor, thereby effecting a voltage drop across the series circuit comprising the internal gate resistor and the intrinsic gate capacitor; and evaluating a measuring voltage dependent on the voltage drop during the discharging of the control electrode which is representative of the junction temperature;

generating discharge pulses of a given pulse width and with a given repetition rate for triggering the discharging of the control electrode of the semiconductor component and for triggering the evaluating process;

comparing the measuring voltage with a threshold value thereby generating an over-temperature signal;

latching the over-temperature signal to an output at rising or falling edges of the discharge pulses; and deactivating the semiconductor component if an over-temperature is detected.

* * * * *